(12) United States Patent
Lin et al.

(10) Patent No.: US 11,694,909 B2
(45) Date of Patent: Jul. 4, 2023

(54) BRUSH CLEANING APPARATUS, CHEMICAL-MECHANICAL POLISHING (CMP) SYSTEM AND WAFER PROCESSING METHOD

(71) Applicant: Taiwan Semiconductor Manufacturing Co., Ltd., Hsin-Chu (TW)

(72) Inventors: Chang-Sheng Lin, Baoshan Township (TW); Hsin-Hsien Lu, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 315 days.

(21) Appl. No.: 16/587,788

(22) Filed: Sep. 30, 2019

(65) Prior Publication Data

US 2020/0027760 A1 Jan. 23, 2020

Related U.S. Application Data

(60) Continuation of application No. 16/108,464, filed on Aug. 22, 2018, now Pat. No. 10,734,254, which is a division of application No. 14/105,242, filed on Dec. 13, 2013, now Pat. No. 10,504,753.

(51) Int. Cl.
*H01L 21/67* (2006.01)
*H01L 21/02* (2006.01)
*B24B 37/34* (2012.01)

(52) U.S. Cl.
CPC ........ *H01L 21/67046* (2013.01); *B24B 37/34* (2013.01); *H01L 21/0209* (2013.01); *H01L 21/67051* (2013.01)

(58) Field of Classification Search
CPC ........ H01L 21/67046; H01L 21/67051; B08B 1/002; B08B 1/006; B08B 1/04
See application file for complete search history.

(56) References Cited

U.S. PATENT DOCUMENTS

| | | | |
|---|---|---|---|
| 4,566,911 A | 1/1986 | Tomita et al. | |
| 4,811,443 A * | 3/1989 | Nishizawa | B08B 3/04 15/97.1 |
| 5,311,634 A | 5/1994 | Andros | |
| 5,725,414 A | 3/1998 | Moinpour et al. | |
| 5,816,900 A * | 10/1998 | Nagahara | B24B 37/24 451/285 |

(Continued)

OTHER PUBLICATIONS

Non-Final Office Action dated Aug. 25, 2016 for U.S. Appl. No. 14/105,242.

(Continued)

*Primary Examiner* — Marc Lorenzi
(74) *Attorney, Agent, or Firm* — Eschweiler & Potashnik, LLC

(57) ABSTRACT

The present disclosure, in some embodiments, relates to a brush cleaning apparatus. The brush cleaning apparatus includes a wafer support configured to support a wafer. The brush cleaning apparatus also includes a cleaning brush including a porous material coupled to a core material. An uppermost surface of the porous material defines a planar cleaning surface. A first nozzle is configured to apply a first cleaning liquid directly between the wafer and the planar cleaning surface of the cleaning brush.

20 Claims, 6 Drawing Sheets

(56) References Cited

U.S. PATENT DOCUMENTS

| | | | |
|---|---|---|---|
| 6,175,983 B1* | 1/2001 | Hirose | H01L 21/67046 15/102 |
| 6,277,203 B1 | 8/2001 | Jiang et al. | |
| 6,299,698 B1 | 10/2001 | Emami et al. | |
| 6,514,121 B1 | 2/2003 | Halley | |
| 6,599,175 B2 | 7/2003 | Herb et al. | |
| 7,077,731 B1 | 7/2006 | Zhang | |
| 7,422,516 B2 | 9/2008 | Butterfield et al. | |
| 2001/0002593 A1 | 6/2001 | Fishkin et al. | |
| 2001/0022008 A1 | 9/2001 | Dickey et al. | |
| 2001/0024691 A1 | 9/2001 | Kimura et al. | |
| 2001/0035197 A1 | 11/2001 | Brown et al. | |
| 2002/0007840 A1 | 1/2002 | Atoh | |
| 2002/0020627 A1 | 2/2002 | Kunisawa et al. | |
| 2002/0028640 A1* | 3/2002 | Barnhart | B08B 1/00 451/41 |
| 2002/0173259 A1 | 11/2002 | Drury | |
| 2005/0109371 A1* | 5/2005 | Sin | B08B 3/02 134/6 |
| 2006/0016029 A1 | 1/2006 | Mikhaylichenko et al. | |
| 2006/0276108 A1 | 12/2006 | Benson | |
| 2007/0095367 A1* | 5/2007 | Wang | H01L 21/67046 134/33 |
| 2007/0224918 A1 | 9/2007 | Terada et al. | |
| 2007/0280724 A1 | 12/2007 | Park | |
| 2008/0026681 A1 | 1/2008 | Butterfield et al. | |
| 2009/0209176 A1 | 8/2009 | Katsuoka et al. | |
| 2011/0139584 A1 | 6/2011 | Gilmartin et al. | |
| 2011/0182653 A1 | 7/2011 | Miller | |
| 2013/0040456 A1 | 2/2013 | Eda et al. | |
| 2013/0061876 A1 | 3/2013 | Suen et al. | |
| 2014/0213056 A1 | 7/2014 | Lu et al. | |
| 2014/0227945 A1 | 8/2014 | Lin et al. | |
| 2014/0227951 A1 | 8/2014 | Lin et al. | |
| 2014/0230170 A1 | 8/2014 | Patel | |
| 2015/0020851 A1* | 1/2015 | Sakurai | H01L 21/67046 15/103.5 |
| 2015/0174727 A1 | 6/2015 | Lin et al. | |

OTHER PUBLICATIONS

Final Office Action dated Mar. 16, 2017 for U.S. Appl. No. 14/105,242.
Non-Final Office Action dated Apr. 18, 2018 for U.S. Appl. No. 14/105,242.
Final Office Action dated Nov. 19, 2018 in connection with U.S. Appl. No. 14/105,242.
Notice of Allowance dated Aug. 15, 2019 in connection with U.S. Appl. No. 14/105,242.
Non-Final Office Action dated Jul. 5, 2019 for U.S. Appl. No. 14/105,242.

* cited by examiner

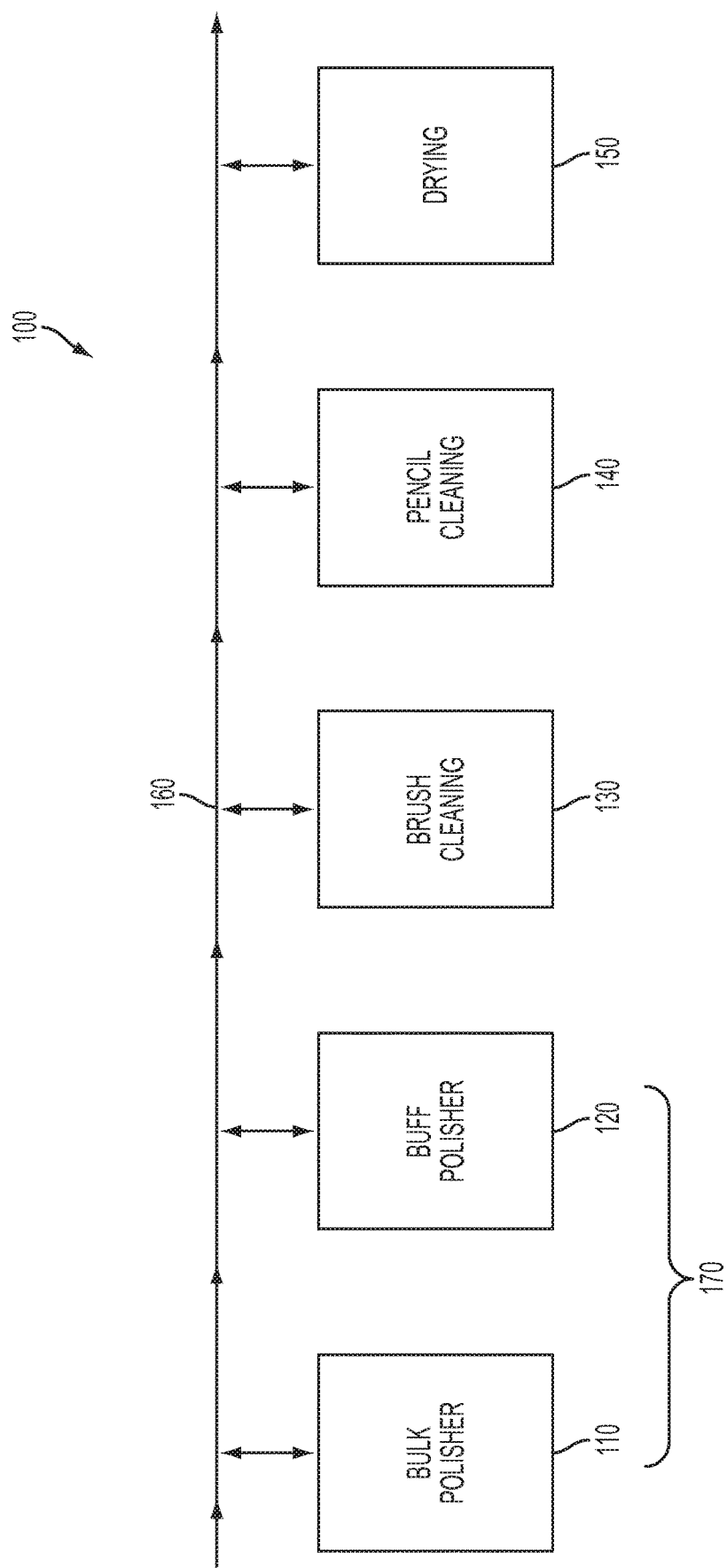

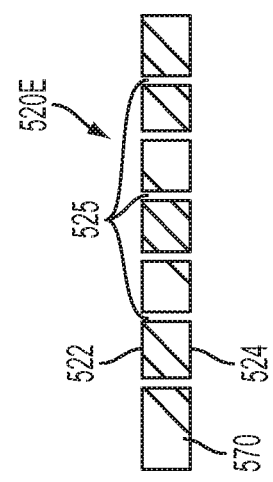
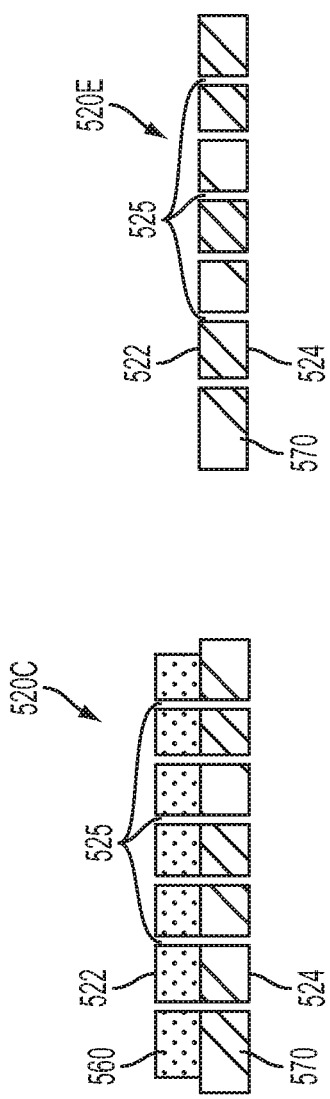
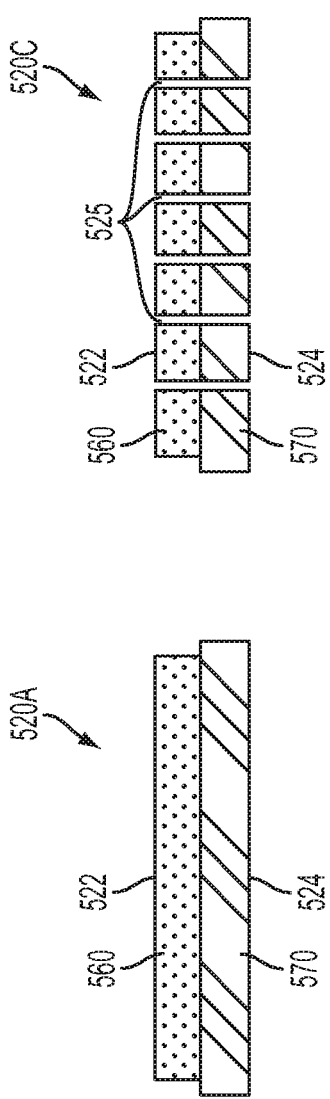
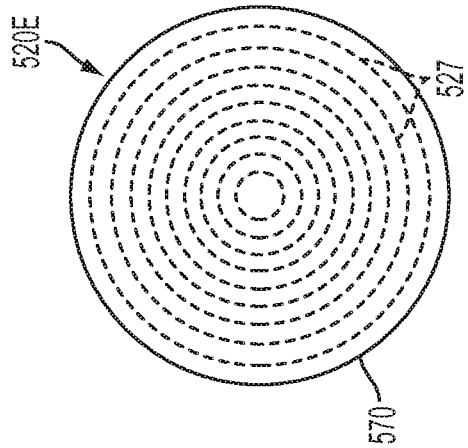
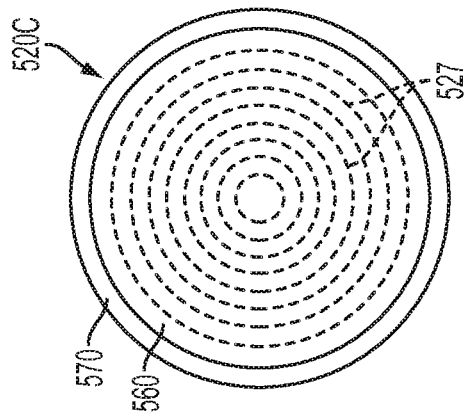
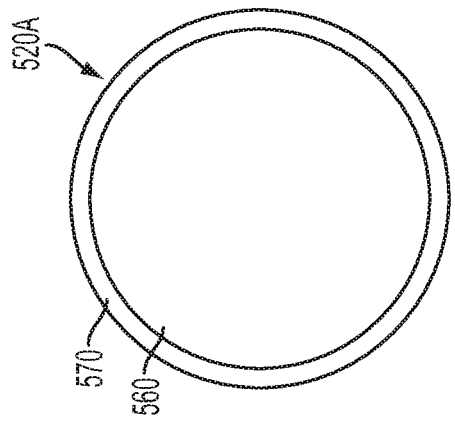

BRUSH CLEANING APPARATUS, CHEMICAL-MECHANICAL POLISHING (CMP) SYSTEM AND WAFER PROCESSING METHOD

REFERENCE TO RELATED APPLICATIONS

This application is a Continuation of U.S. application Ser. No. 16/108,464, filed on Aug. 22, 2018, which is a Divisional of U.S. application Ser. No. 14/105,242, filed on Dec. 13, 2013. The contents of the above-referenced patent applications are hereby incorporated by reference in their entirety.

BACKGROUND

During a manufacturing process of semiconductor devices, various features are sequentially formed on a wafer resulting in an increasingly non-planar surface of the wafer. Such a non-planar surface is planarized to improve quality and/or uniformity of features subsequently formed on the wafer. Chemical mechanical polishing (CMP) is a wafer processing technique that is used to planarize surfaces of wafers. A CMP process removes excess materials, such as dielectric and/or conductive layers, from a surface of a wafer. The planarization operation leaves contaminants, such as residues of the removed materials, on the planarized surface. A brush cleaning operation is performed to remove such contaminants from the planarized surface, readying the wafer for subsequent processing.

BRIEF DESCRIPTION OF THE DRAWINGS

One or more embodiments are illustrated by way of example, and not by limitation, in the figures of the accompanying drawings, wherein elements having the same reference numeral designations represent like elements throughout. The drawings are not to scale, unless otherwise disclosed.

FIG. 1 is a schematic block diagram of a CMP system in accordance with some embodiments.

FIG. 5A is a schematic side view and FIG. 5B is a schematic top view of a cleaning brush in accordance with some embodiments.

FIG. 5C is a schematic side view and FIG. 5D is a schematic top view of a cleaning brush in accordance with some embodiments.

FIG. 5E is a schematic side view and FIG. 5F is a schematic top view of a cleaning brush in accordance with some embodiments.

DETAILED DESCRIPTION

Figure 2A:
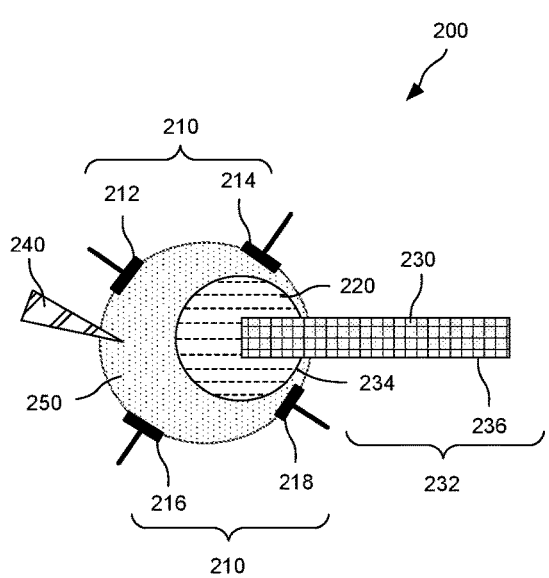
FIG. 2A is a schematic top view and FIG. 2B is a schematic side view of a brush cleaning apparatus in accordance with some embodiments.

It is to be understood that the following disclosure provides many different embodiments or examples, for implementing different features of various embodiments. Specific examples of components and arrangements are described below to simplify the present disclosure. An inventive concept may; however, be embodied in many different forms and should not be construed as being limited to the embodiments set forth herein. It will be apparent; however, that one or more embodiments may be practiced without these specific details.

In some embodiments, a brush cleaning operation includes bringing a planar cleaning surface of at least one cleaning brush into contact with a surface of a wafer, during a relative movement between the cleaning brush and the wafer, to remove contaminants from the wafer surface. The planar cleaning surface contacts the wafer surface in a surface contact, permitting a relatively wide area, in at least one embodiment, the entire area, of the wafer surface to be brushed at the same time. Compared to other approaches where a rotating roller is used as the cleaning brush and contacts the wafer in a line contact, the brush cleaning operation in accordance with some embodiments provides a wider contact area and greater cleaning efficiency.

FIG. 1 is a schematic block diagram of a CMP system 100 in accordance with some embodiments. The CMP system 100 includes a bulk polisher 110, a buff polisher 120, a brush cleaning apparatus 130, a pencil cleaning apparatus 140, and a drying apparatus 150 arranged sequentially along a process line 160.

The bulk polisher 110 is configured to reduce a thickness of a wafer. In some embodiments, the bulk polisher 110 includes a rotatable polishing pad, one or more nozzles for dispensing a CMP slurry on the polishing pad, and a carrier head configured to hold the wafer with the wafer surface to be planarized facing the polishing pad. In a bulk polishing operation, the polishing pad is rotated, the carrier head presses the wafer surface to be planarized against the rotating polishing pad, and the CMP slurry is dispensed on the polishing pad. The CMP slurry helps to remove material from the wafer surface through a combination of chemical and/or mechanical actions. In at least one embodiment, the CMP slurry chemically reacts with the material to be removed to soften or dissolute the material. In at least one embodiment, the CMP slurry includes abrasive particles to increase the mechanical grinding effect. An average thickness reduction of the wafer during a polishing operation divided by the duration of the polishing operation is referred to as the removal rate. The removal rate of the bulk polishing operation performed by the bulk polisher 110 depends on a number of factors including, but not limited to, the hardness of the polishing pad, the pressure with which the wafer surface is pressed against the polishing pad, the CMP slurry composition, the relative velocity between the wafer surface and the polishing pad, and other like factors.

The buff polisher 120 is arranged downstream of the bulk polisher 110 in the process line 160, and is configured to further reduce a thickness of the wafer at a removal rate lower than that of the bulk polisher 110. In some embodiments, the buff polisher 120 includes elements similar to those described with respect to the bulk polisher 110. To achieve a removal rate lower than the bulk polisher 110, the buff polisher 120 includes, in one or more embodiments, a softer polishing pad than the polishing pad of the bulk polisher 110 and/or finer CMP slurry abrasive particles than used by the bulk polisher 110. Other arrangements are within the scope of various embodiments.

The bulk polisher 110 and buff polisher 120 are commonly referred to as a polishing apparatus 170, and the corresponding bulk polishing operation and buff polishing operation are commonly referred to as a polishing operation. In at least one embodiment, the polishing apparatus 170 includes more than one bulk polisher 110 and/or more than one buff polisher 120. In at least one embodiment, the bulk polisher 110 or the buff polisher 120 is omitted from the polishing apparatus 170, and the corresponding bulk polishing operation or buff polishing operation is omitted from the polishing operation of the polishing apparatus 170. In at least one embodiment, the polishing operation is performed on one surface of the wafer. In at least one embodiment, the polishing operation is performed on both opposite surfaces of the wafer.

The polishing operation removes a thickness of the wafer being planarized, but leaves contaminants on the wafer. Examples of contaminants include residues of the material being removed from the wafer, abrasive particles contained in the CMP slurry or dislodged from the polishing pad, particles formed by agglomeration of the CMP slurry, byproducts of the chemical reaction between the CMP slurry and the material of the wafer, other foreign matters, and like contaminants. In some situations, contaminants are present on both surfaces of the wafer even if the polishing operation is performed on one of the surfaces.

The brush cleaning apparatus 130 is arranged downstream of the polishing apparatus 170 and configured to remove contaminants from the wafer in a brush cleaning operation. The brush cleaning apparatus 130 includes at least one cleaning brush having a planar cleaning surface. In the brush cleaning operation, the planar cleaning surface is brought into contact with a surface to be brush-cleaned of the wafer, during a relative movement between the cleaning brush and the wafer, thereby removing contaminants from the wafer surface. In at least one embodiment, the brush cleaning apparatus 130 includes one or more nozzles configured to supply at least one cleaning liquid to an interface between the wafer surface and the cleaning brush to improve the efficiency and/or quality of the brush cleaning operation. In at least one embodiment, the brush cleaning apparatus 130 includes a pair of cleaning brushes for performing the brush cleaning operation on both opposite surfaces of the wafer simultaneously. In some embodiments, the brush cleaning operation does not reduce a thickness of the wafer.

The pencil cleaning apparatus 140 is arranged downstream of the brush cleaning apparatus 130 and configured to remove contaminants remaining on the wafer surface(s) after the brush cleaning operation performed by the brush cleaning apparatus 130. In some embodiments, the pencil cleaning apparatus 140 includes a pencil type cleaning element configured to come into contact with the wafer surface during a relative movement between the pencil type cleaning element and the wafer, to remove the remaining contaminants from the wafer surface. In at least one embodiment, the pencil cleaning apparatus 140 includes one or more nozzles configured to dispense at least one cleaning liquid onto the wafer surface to improve the efficiency and/or quality of the pencil cleaning operation. In at least one embodiment, the pencil cleaning operation is performed on one surface of the wafer. In at least one embodiment, the pencil cleaning operation is performed on both opposite surfaces of the wafer. In one or more embodiments, the pencil cleaning apparatus 140 is omitted from the CMP system 100.

The drying apparatus 150 is arranged downstream of the pencil cleaning apparatus 140, or downstream of the brush cleaning apparatus 130 when the pencil cleaning apparatus 140 is omitted. The drying apparatus 150 is configured to dry the cleaning liquid(s) supplied to the wafer during the brush cleaning operation and/or the pencil cleaning operation. In at least one embodiment, the drying apparatus 150 includes a spinning unit configured to dry the cleaned wafer in a spin drying operation. Other arrangements for drying the cleaned wafer are within the scope of various embodiments. In at least one embodiment, the drying apparatus 150 further includes a rinsing unit configured to rinse the cleaned wafer, for example, with water, before drying the cleaned and rinsed wafer. The cleaned and dried wafer is further transferred downstream of the drying apparatus 150 along the process line 160 to subsequent processing.

Figure 2B:
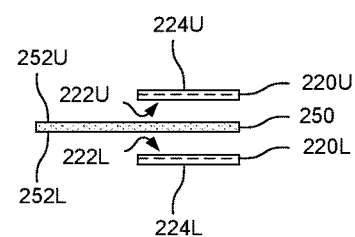

FIG. 2A is a schematic top view and FIG. 2B is a schematic side view of a brush cleaning apparatus 200 in accordance with some embodiments. In at least one embodiment, the brush cleaning apparatus 200 corresponds to the brush cleaning apparatus 130 in the CMP system 100 described with respect to FIG. 1. However, the brush cleaning apparatus 200 is not limited to CMP systems. For example, in one or more embodiments, the brush cleaning apparatus 200 is configured to perform a brush cleaning operation after a deep chemical vapor deposition (CVD) process.

As shown in FIG. 2A, the brush cleaning apparatus 200 includes a wafer support 210, at least one cleaning brush 220, a cleaning brush moving mechanism 230, and at least one nozzle 240.

The wafer support 210 is configured to support a wafer 250 to be brush-cleaned. The wafer support 210 includes a plurality of wafer holding elements 212, 214, 216, 218 arranged around a peripheral edge of the wafer 250, and configured to hold the wafer 250 at the peripheral edge. In at least one embodiment, the wafer holding elements 212, 214, 216, 218 include claws for holding the wafer 250 in a fixed position relative to the wafer support 210. In at least one embodiment, the wafer holding elements 212, 214, 216, 218 include rollers for holding the peripheral edge of the wafer 250 while permitting the wafer 250 to rotate relative to the wafer support 210. In some embodiments, the wafer support 210 is configured to hold the wafer 250 stationary during a brush cleaning operation. In some embodiments, the wafer support 210 is configured to move the wafer 250, or permit the wafer 250 to move, during the brush cleaning operation. Other arrangements are within the scope of various embodiments.

The at least one cleaning brush 220 is configured to brush contaminants off a surface of the wafer 250. In at least one embodiment, the at least one cleaning brush 220 includes one cleaning brush for brush-cleaning one surface of the wafer 250. In at least one embodiment, the at least one cleaning brush 220 includes a pair of cleaning brushes for brush-cleaning both opposite surfaces of the wafer 250. For example, as shown in FIG. 2B, the at least one cleaning brush 220 includes a pair of cleaning brushes 220U, 220L arranged on opposite sides of the wafer 250, for brush-cleaning the corresponding opposite surfaces 252U, 252L of the wafer 250. For simplicity, the wafer support 210 and the cleaning brush moving mechanism 230 are omitted from FIG. 2B.

The at least one cleaning brush 220 has a planar cleaning surface configured to come into contact with the wafer 250 supported by the wafer support 210 to remove contaminants from the wafer 250. For example, as shown in FIG. 2B, the cleaning brush 220U has, on a first side facing the corresponding surface 252U of the wafer 250, a planar cleaning surface 222U configured to come into contact with the surface 252U and remove contaminants from the surface 252U in a brush cleaning operation. The cleaning brush 220U further has a second side (or non-cleaning side) 224U opposite to the planar cleaning surface 222U. Similarly, the cleaning brush 220L has, on a first side facing the corresponding surface 252L of the wafer 250, a planar cleaning surface 222L configured to come into contact with the surface 252L and remove contaminants from the surface 252L in a brush cleaning operation. The cleaning brush 220L further has a second side 224L opposite to the planar cleaning surface 222L.

The cleaning brush moving mechanism 230 is configured to cause a relative movement between the at least one cleaning brush 220 and the wafer 250 supported by the wafer support 210. The cleaning brush moving mechanism 230 includes a robot arm 232 having opposite first and second ends 234, 236. The at least one cleaning brush 220 is rotatably attached to the first end 234 of the robot arm 232, and is rotatable relative to the first end 234. The robot arm 232 is pivotable about the second end 236 to swing the at least one cleaning brush 220 across the wafer 250. The robot arm 232 and/or the at least one cleaning brush 220 is/are further moveable toward and away from the wafer support 210 in a thickness direction (or a normal direction) of the wafer 250 supported by the wafer support 210. In at least one embodiment, the robot arm 232 is moveable translationally and/or rotationally relative to the wafer support 210 in a plane parallel to the plane of the wafer 250 supported by the wafer support 210. The cleaning brush moving mechanism 230 includes one or more motors and/or hydraulic cylinders and/or other driving mechanisms to effect the described movements of the robot arm 232 and/or the at least one cleaning brush 220. Other arrangements for moving the at least one cleaning brush 220 relative to the wafer 250 are within the scope of various embodiments.

The nozzle 240 is configured to supply at least one cleaning liquid to the surface contact between the at least one cleaning brush 220 and the wafer 250. Example cleaning liquids include, but are not limited to, water, deionized (DI) water, and one or more chemicals such as $NH_4OH$, HF and the like. In at least one embodiment, the cleaning liquid supplied by the nozzle 240 dislodges contaminants from the wafer surface and the dislodged contaminants are brushed off by the at least one cleaning brush 220. In at least one embodiment, the cleaning liquid further maintains an intended wetness at the contact between the at least one cleaning brush 220 and the wafer 250, to reduce abrasive damage to the wafer surface.

In a brush cleaning operation, the cleaning brush moving mechanism 230 causes a relative movement between the at least one cleaning brush 220 and the wafer 250 supported by the wafer support 210. During the relative movement between the at least one cleaning brush 220 and the wafer 250, the planar cleaning surface of the at least one cleaning brush 220 is brought into contact with the wafer surface to be brush-cleaned. As a result, contaminants are brushed off the wafer surface by the surface contact between the planar cleaning surface and the wafer surface. Compared to other approaches where a rotating roller is used as the cleaning brush and contacts the wafer in a line contact, the brush cleaning operation in accordance with some embodiments provides a wider contact area and greater cleaning efficiency. In addition, potential cleaning defects due to unbalance or shifting of the rotating roller in the other approaches are avoidable in some embodiments, because the surface contact between the cleaning brush and the wafer in some embodiments is more stable than the line contact between the rotating roller and the wafer in the other approaches.

In the specifically disclosed embodiment shown in FIG. 2A, the shape of the at least one cleaning brush 220 is circular. However, such a circular shape is an example and does not affect the brush cleaning operation in one or more embodiments, especially when the at least one cleaning brush 220 is rotated during the brush cleaning operation. Other shapes of the at least one cleaning brush 220 are within the scope of various embodiments.

In some embodiments, the planar cleaning surface of the at least one cleaning brush 220 and the plane of the wafer 250 are oriented in a direction between the vertical direction and the horizontal direction. In at least one embodiment, the planar cleaning surface of the at least one cleaning brush 220 and the plane of the wafer 250 are oriented vertically to be perpendicular to the ground surface. In at least one embodiment, the planar cleaning surface of the at least one cleaning brush 220 and the plane of the wafer 250 are oriented horizontally to be parallel to the ground surface.

In some embodiments, the at least one cleaning brush 220 includes a porous material defining the planar cleaning surface. For example, the cleaning brush 220U includes a porous material defining the planar cleaning surface 222U and/or the cleaning brush 220L includes a porous material defining the planar cleaning surface 222L. Example porous materials for the planar cleaning surfaces include, but are not limited to, one or more of polyvinyl alcohol (PVA), polyamide (PA), polyurethane (PU), polybutylene terephthalate (PBT), and polyethylene terephthalate (PET). Such porous materials are selected in one or more embodiments for their softness which permits contaminants to be brushed off without damaging the wafer surface. The porous material in one or more embodiments further functions as a sponge for holding, and/or as a medium for transferring, the cleaning liquid as described herein. The cleaning liquid keeps the contact between the planar cleaning surface and the wafer surface at an intended wetness, improves the cleaning efficiency and reduces potential abrasive damage to the wafer surface.

In some embodiments, the porous material has a porosity in range from 5% to 80%. In at least one embodiment, the porosity of the porous material is determined at a surface or a cross-section of the porous material. The total area of all pores in a region of the surface or cross-section of the porous material is determined. The total area of the region is determined. The porosity of the porous material is determined as a ratio of the total area of all pores in the region at the surface or cross-section to the total area of the region. When the porosity of the porous material is lower than 5%, the mount of cleaning liquid holdable and/or transferable by the porous material is potentially insufficient for maintaining an intended wetness at the contact between the planar cleaning surface and the wafer surface, thereby potentially reducing cleaning efficiency and/or causing damage to the wafer surface. When the porosity of the porous material is higher than 80%, the contact area between the planar cleaning surface and the wafer surface is potentially insufficient to provide an intended cleanliness which depends on both the presence of the cleaning liquid at, and the area of, the contact between the planar cleaning surface and the wafer surface. In at least one embodiment, the porosity of the porous material ranges from 20% to 60%.

In some embodiments, the porous material has a pore size in range from 5 um to 200 um. In at least one embodiment, the pore size of the porous material is determined at a surface or a cross-section of the porous material. An average diameter of all pores in a region of the surface or cross-section of the porous material is determined as the pore size of the porous material. When the pore size of the porous material is lower than 5 um, the mount of cleaning liquid holdable and/or transferable by the porous material is potentially insufficient for maintaining an intended wetness at the contact between the planar cleaning surface and the wafer surface, thereby potentially reducing cleaning efficiency. When the pore size of the porous material is higher than 200 um, a cleaning quality and/or mechanical strength of the cleaning brush is/are potentially insufficient. In at least one embodiment, the pore size of the porous material ranges from 30 um to 150 um.

Figure 2C:
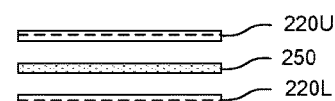
FIGS. 2C-2D are schematic side views of various brush cleaning apparatuses in accordance with some embodiments.
Figure 2D:
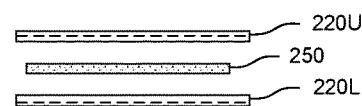

In some embodiments, a size of the cleaning brush in plan view (i.e., when seen in the direction normal to the wafer surface) is smaller than a size of the wafer in plan view. For example, the size of the cleaning brush 220U or 220L in FIG. 2B is smaller than the size of the wafer 250. In some embodiments, the size of the cleaning brush in plan view is equal to the size of the wafer in plan view. For example, the size of the cleaning brush 220U or 220L in FIG. 2C is equal to the size of the wafer 250. In some embodiments, the size of the cleaning brush in plan view is greater than the size of the wafer in plan view. For example, the size of the cleaning brush 220U or 220L in FIG. 2D is greater than the size of the wafer 250. In some embodiments, the sizes of the planar cleaning surfaces 222U are 222L are different from each other. For example, in at least one embodiment, the size of the cleaning brush 220U is greater than the size of the wafer 250 which, in turn, is greater than the size of the cleaning brush 220L.

In some embodiments, the size of the cleaning brush in plan view is in a range from 0.55 to 1.5 times of the size of the wafer in plan view. As the size of the cleaning brush becomes smaller compared to the size of the wafer, the at least one cleaning brush 220 moves over a longer period and/or a greater distance to clean the wafer surface of the wafer 250 which, in turn, results in a longer brush cleaning operation and/or consumes a greater amount of the cleaning liquid. When the size of the cleaning brush is smaller than 0.55 times of the size of the wafer, the length of the brush cleaning operation and/or the amount of consumed cleaning liquid per brush cleaning operation potentially reach a level that significantly affects the efficiency of the brush cleaning operation.

As the size of the cleaning brush becomes greater compared to the size of the wafer, the at least one cleaning brush 220 moves over a shorter period and/or a shorter distance to clean the wafer surface of the wafer 250 which, in turn, results in a shorter brush cleaning operation and/or consumes a smaller amount of the cleaning liquid. When the size of the cleaning brush is equal or greater than the size of the wafer, as shown in FIGS. 2C-2D, some embodiments eliminate a relative translational movement between the at least one cleaning brush 220 and the wafer 250, and maintain a relative rotational movement therebetween, thereby reducing power consumption. However, when the size of the cleaning brush is greater than 1.5 times of the size of the wafer, there is a potential difficulty in mechanical handling and/or movement of such a large size cleaning brush. In at least one embodiment, the size of the cleaning brush ranges from 0.6 times to 1.2 times the size of the wafer.

In some embodiments, the relationship between the size of the cleaning brush and the size of the wafer is a factor to be considered in arranging one or more nozzles for supplying one or more cleaning liquids for the brush cleaning operation.

Figure 3A:
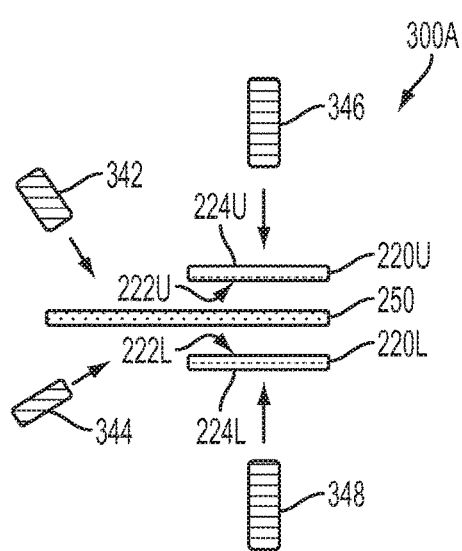
FIGS. 3A and 3B are schematic side views of various brush cleaning apparatuses in accordance with some embodiments.

FIG. 3A is a schematic side view of a brush cleaning apparatus 300A in accordance with some embodiments. For simplicity, the wafer support and the cleaning brush moving mechanism are omitted from FIG. 3A. The brush cleaning apparatus 300A include a plurality of nozzles 342, 344, 346, 348 corresponding to the nozzle 240 described with respect to FIG. 2A.

In the brush cleaning apparatus 300A, the cleaning brushes 220U and 220L are smaller than the wafer 250. As a result, the nozzles 342, 344 directed at an area of the wafer 250 not obstructed by the cleaning brushes 220U and 220L are used in one or more embodiments to directly supply the corresponding one or more cleaning liquids to the corresponding surfaces of the wafer 250. The supplied cleaning liquid is brought to the contact between the wafer 250 and the planar cleaning surfaces 222U, 222L by relative movements between the at least one cleaning brush 220 and the wafer 250.

In one or more embodiments, the nozzles 346, 348 are used in addition to or in lieu of the nozzles 342, 344 to indirectly supply the corresponding one or more cleaning liquids to the corresponding surfaces of the wafer 250. The nozzles 346, 348 are directed at the non-cleaning sides 224U, 224L of the corresponding cleaning brushes 220U and 220L which are opposite to the planar cleaning surfaces 222U, 222L. The cleaning liquid(s) supplied to the non-cleaning sides 224U, 224L is/are transferred through the porous material of the corresponding cleaning brushes 220U and 220L to the corresponding planar cleaning surfaces 222U, 222L.

Figure 3B:
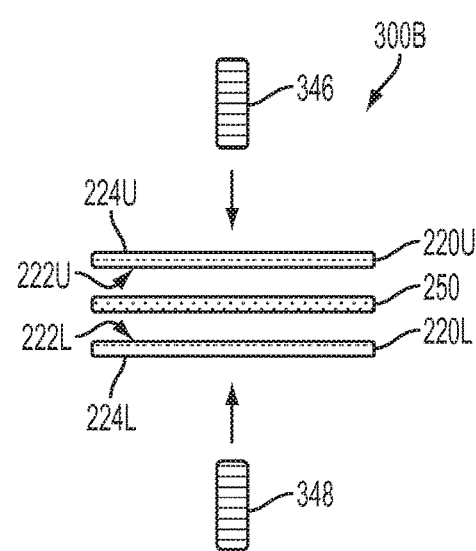

FIG. 3B is a schematic side view of a brush cleaning apparatus 300B in accordance with some embodiments. For simplicity, the wafer support and the cleaning brush moving mechanism are omitted from FIG. 3B. The brush cleaning apparatus 300B include the nozzles 346, 348.

In the brush cleaning apparatus 300B, the cleaning brushes 220U and 220L have a size about equal to or greater than that of the wafer 250. As a result, the wafer surfaces of the wafer 250 are substantially covered by the cleaning brushes 220U and 220L and it is difficult to directly supply one or more cleaning liquids to the surfaces to be brush-cleaned of the wafer 250. The nozzles 342, 344 described with respect to the brush cleaning apparatus 300A are omitted, or provided but not used, in the brush cleaning apparatus 300B. The brush cleaning apparatus 300B uses the nozzles 346, 348 to indirectly supply one or more cleaning liquids to the corresponding surfaces of the wafer 250 via the porous material of the cleaning brushes 220U and 220L, as described with respect to FIG. 3A.

In some embodiments, the transfer of cleaning liquid through the cleaning brush is enhanced by forming holes extending through the cleaning brush.

Figure 4A:
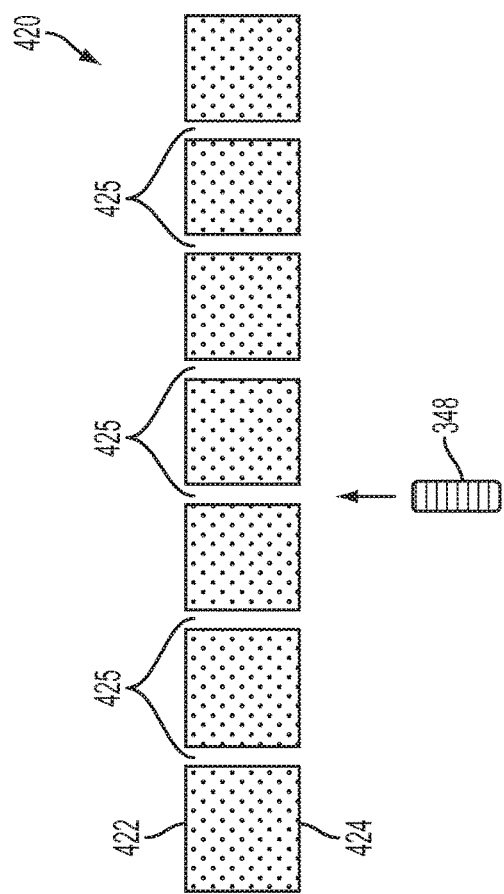
FIG. 4A is a schematic side view of a cleaning brush in accordance with some embodiments.

FIG. 4A is a schematic side view of a cleaning brush 420 in accordance with some embodiments. In at least one embodiment, the cleaning brush 420 corresponds to the at least one cleaning brush 220, the cleaning brush 220U or the cleaning brush 220L as described herein.

The cleaning brush 420 is formed of a porous material, and has a planar cleaning surface 422 and an opposite non-cleaning side 424. The cleaning brush 420 further includes a plurality of holes 425 extending through the cleaning brush 420, from the non-cleaning side 424 to the planar cleaning surface 422. Example opening shapes of the holes 425 include, but are not limited to, circle, triangle, square, and other like shapes. In one or more embodiments, the holes 425 have straight sidewalls between the openings on the opposite sides 422, 424 of the cleaning brush 420. In one or more embodiments, the holes 425 extend perpendicular to a plane of the cleaning brush 420. An example method of forming the holes 425 includes laser drilling. A cleaning liquid dispensed by the nozzle 348 on the non-cleaning side 424 is transferred to the planar cleaning surface 422 via both the porous material of the cleaning brush 420 and the holes 425. As a result, the cleaning liquid transfer efficiency and/or the cleaning efficiency is/are increased.

In some embodiments, the holes 425 have an average hole size in a range from 0.5 mm to 2 mm.

In some embodiments, adjacent holes among the holes 425 are arranged at an edge-to-edge pitch in a range from 2 to 4 times of the average hole size.

When the average hole size is smaller than 0.1 mm and/or the pitch between adjacent holes 425 is greater than 5 times of the average hole size, the amount of cleaning liquid transferred via the holes 425 and one or more positive effects associated therewith is/are limited. When the average hole size is greater than 2.5 mm and/or the pitch between adjacent holes 425 is less than 2 times of the average hole size, the amount of cleaning liquid transferred via the holes 425 potentially becomes excessive, which results in potential waste of cleaning liquid.

Figure 4D:
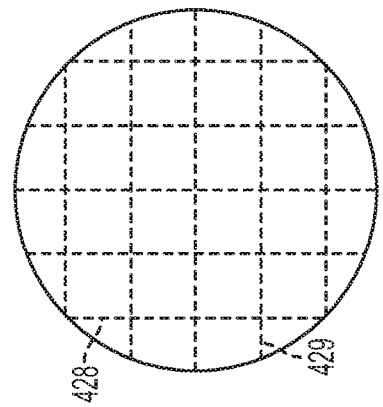
FIGS. 4B-4D are schematic top views of various cleaning brushes in accordance with some embodiments.
Figure 4C:
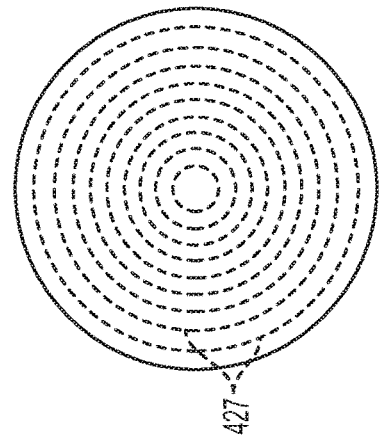
Figure 4B:
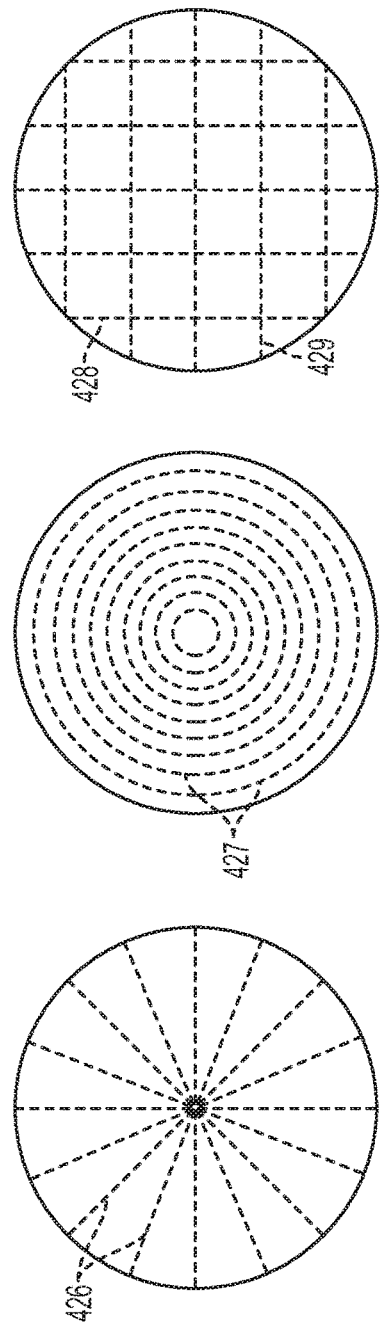

FIGS. 4B-4D are schematic top views of various cleaning brushes, showing various arrangements of holes 425 in accordance with some embodiments. As shown in FIG. 4B, the holes 425 are arranged along diametrical lines 426 in one or more embodiments. As shown in FIG. 4C, the holes 425 are arranged along concentric circles 427 in one or more embodiments. As shown in FIG. 4D, the holes 425 are arranged along a plurality of columns 428 and a plurality of rows 429 in one or more embodiments. The arrangements shown in FIGS. 4B-4D are examples. Other arrangements and/or combinations of the described arrangements are within the scope of various embodiments.

FIG. 5A is a schematic side view and FIG. 5B is a schematic top view of a cleaning brush 520A in accordance with some embodiments. In at least one embodiment, the cleaning brush 520A corresponds to the at least one cleaning brush 220, the cleaning brush 220U or the cleaning brush 220L as described herein.

The cleaning brush 520A includes a porous material 560 defining a planar cleaning surface 522, and a core material 570 defining the non-cleaning side 524. The porous material 560 is attached to the core material 570. Example techniques for attaching the porous material 560 to the core material 570 include, but are not limited to, adhesive, heat bonds, co-molding, coating and other like techniques. In at least one embodiment, the core material 570 is mechanically and/or chemically stronger than the porous material 560 to improve robustness and/or service life of the cleaning brush 520A. In one or more embodiments, the core material 570 is a non-porous material. Example materials of the core material 570 include, but are not limited to, at least one of polypropene (PP), polythene (PE), and polyvinyl chloride (PVC). In the specifically disclosed embodiment shown in FIGS. 5A-5B, the size of the core material 570 in plan view is larger than that of the porous material 560. However, such an arrangement is an example. Other arrangements are within the scope of various embodiments. For example, in one or more embodiments, the size of the core material 570 is equal to the size of the porous material 560.

FIG. 5C is a schematic side view and FIG. 5D is a schematic top view of a cleaning brush 520C in accordance with some embodiments. In at least one embodiment, the cleaning brush 520C corresponds to the at least one cleaning brush 220, the cleaning brush 220U or the cleaning brush 220L as described herein.

The cleaning brush 520C is similar to the cleaning brush 520A, except that the cleaning brush 520C additionally includes a plurality of holes 525 extending through the porous material 560 and the core material 570, from the non-cleaning side 524 to the planar cleaning surface 522. In some embodiments, the holes 525 correspond to the holes 425 as described herein. For example, as shown in FIG. 5D, the holes 525 are arranged in concentric circles 527. The holes 525 function to transfer a cleaning liquid dispensed on the non-cleaning side 524 to the planar cleaning surface 522, as described herein with respect to the holes 425.

FIG. 5E is a schematic side view and FIG. 5F is a schematic top view of a cleaning brush 520E in accordance with some embodiments. In at least one embodiment, the cleaning brush 520C corresponds to the at least one cleaning brush 220, the cleaning brush 220U or the cleaning brush 220L as described herein.

The cleaning brush 520E is similar to the cleaning brush 520C, except that the porous material 560 is omitted. The planar cleaning surface 522 is defined by the core material 570. In at least one embodiment, the core material 570 includes a non-porous material. A cleaning liquid is held in or transferred through the holes 525 of the cleaning brush 520E as described herein.

Figure 6:
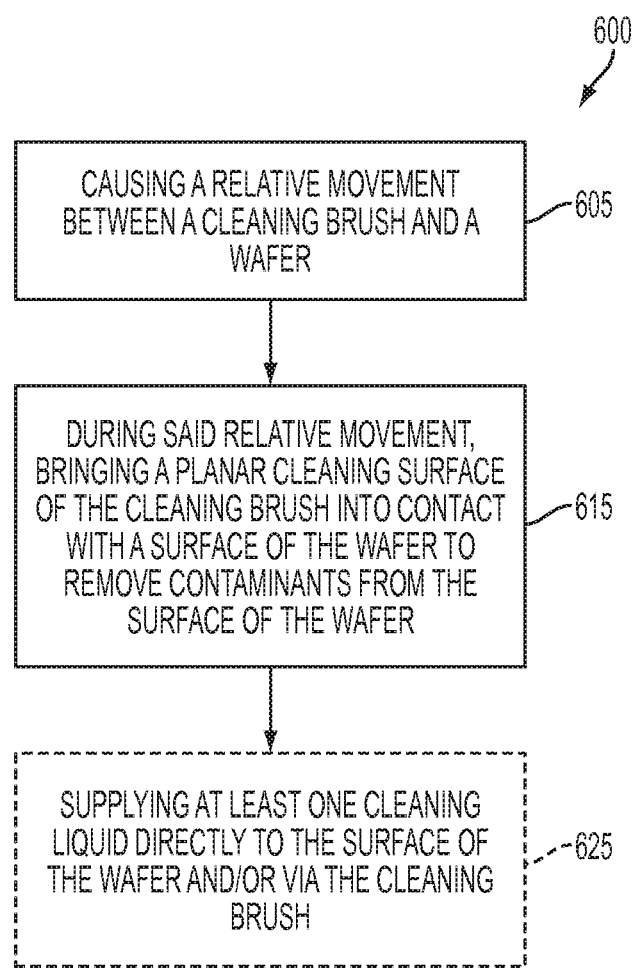
FIG. 6 is a flow chart of a brush cleaning process in accordance with some embodiments.

FIG. 6 is a flow chart of a brush cleaning process 600 in accordance with some embodiments. In at least one embodiment, the brush cleaning process 600 is performed by the brush cleaning apparatus 200 using one or more of the cleaning brushes described with respect to FIGS. 2A-5F.

At operation 605, a relative movement is caused between a cleaning brush and a wafer. For example, a cleaning brush moving mechanism 230 is operated to cause a relative translational and/or rotational movement between a cleaning brush 220U and/or 220L and a wafer 250, as described with respect to FIGS. 2A-2B.

At operation 615, during the relative movement between the cleaning brush and the wafer, a planar cleaning surface of the cleaning brush is brought into contact with a surface of the wafer to remove contaminants from the surface of the wafer. For example, during the relative movement between the cleaning brush 220U and/or 220L and the wafer 250, a planar cleaning surface 222U or 222L of the cleaning brush 220U and/or 220L is brought into contact with the corresponding surface 252U and/or 252L of the wafer 250 to remove contaminants from the 252U and/or 252L of the wafer 250, as described with respect to FIGS. 2A-2B.

At operation 625, at least one cleaning liquid is supplied directly to the surface of the wafer and/or via the cleaning brush. For example, a cleaning liquid is supplied directly to the surface of the wafer 250 from the nozzles 342, 344, as described with respect to FIG. 3A. Alternatively or additionally, a cleaning liquid is supplied to the surface of the wafer 250 from the nozzles 346, 348 and through the cleaning brush 220U and/or 220L, as described with respect to FIGS. 3A-3B. In some embodiments, operation 625 is omitted.

One or more effects discussed with respect to the brush cleaning apparatus and cleaning brushes described in reference to FIGS. 2A-5F is/are achievable by the brush cleaning process 600 in accordance with some embodiments.

The above method(s) include(s) example operations, but the operations in some embodiments are not performed in the order shown. Operations may be added, replaced, changed order, and/or eliminated as appropriate, in accordance with the spirit and scope of embodiments of the disclosure. Embodiments that combine different features and/or different embodiments are within the scope of the disclosure and will be apparent to those of ordinary skill in the art after reviewing this disclosure.

According to some embodiments, a brush cleaning apparatus comprises a wafer support configured to support a wafer, and at least one cleaning brush moveable relative to the wafer support. The at least one cleaning brush has opposite first and second sides, and, on the first side, a planar cleaning surface configured to come into contact with the wafer supported by the wafer support to remove contaminants from the wafer.

According to some embodiments, a chemical-mechanical polishing (CMP) system comprises a polishing apparatus configured to reduce a thickness of a wafer, and a brush cleaning apparatus arranged downstream of the polishing apparatus. The brush cleaning apparatus comprises a pair of cleaning brushes configured to face and move relative to opposite surfaces of the wafer. The cleaning brushes have planar cleaning surfaces configured to come into contact with the corresponding surfaces of the wafer to remove contaminants from the surfaces of the wafer.

In a method of processing a wafer, a relative movement is caused between a cleaning brush and a wafer. During the relative movement, a planar cleaning surface of the cleaning brush is brought into contact with a surface of the wafer to remove contaminants from the surface of the wafer. A size of the cleaning brush, in plan view, is in a range from 0.55 to 1.5 times of a size of the wafer in plan view.

It will be readily seen by one of ordinary skill in the art that one or more of the disclosed embodiments fulfill one or more of the advantages set forth above. After reading the foregoing specification, one of ordinary skill will be able to affect various changes, substitutions of equivalents and various other embodiments as broadly disclosed herein. It is therefore intended that the protection granted hereon be limited only by the definition contained in the appended claims and equivalents thereof.

What is claimed is:

1. A brush cleaning apparatus, comprising:
   a substrate support configured to support a substrate;
   a planar cleaning brush having opposite first and second sides;
   a first nozzle configured to spray a cleaning liquid directly onto a backside of the planar cleaning brush, wherein a bottom of the first nozzle is separated from a top of the backside of the planar cleaning brush by a non-zero distance spanning an open region over the backside of the planar cleaning brush;
   a second nozzle configured to apply the cleaning liquid directly onto the substrate;
   wherein the first side comprises a planar cleaning surface defined by a porous material and configured to come into contact with the substrate supported by the substrate support;
   wherein the second side is defined by a core material, the core material having a bottommost surface that faces the substrate and that physically contacts a topmost surface of the porous material;
   wherein interior vertical sidewalls of the core material extend from a topmost surface of the core material to the bottommost surface of the core material to define a plurality of holes respectively extending through the core material, wherein the plurality of holes are configured to transfer the cleaning liquid, which is dispensed directly onto the second side of the planar cleaning brush, from the second side of the planar cleaning brush to the porous material;
   wherein additional interior vertical sidewalls of the porous material extend from the topmost surface of the porous material to a bottommost surface of the porous material to define a plurality of openings that are directly below the plurality of holes, the plurality of holes and the plurality of openings collectively forming a continuous and linear path between the topmost surface of the core material and the bottommost surface of the porous material, as viewed in a cross-sectional view; and
   wherein two of the interior vertical sidewalls within the core material and two of the additional interior vertical sidewalls of the porous material are separated by equal distances.

2. The brush cleaning apparatus of claim 1, wherein the core material has a circular shape as viewed in a top-view of the core material.

3. The brush cleaning apparatus of claim 1, wherein the bottommost surface of the core material laterally extends past opposing outermost sidewalls of the porous material.

4. The brush cleaning apparatus of claim 1, wherein the porous material comprises one of polyvinyl alcohol (PVA), polyamide (PA), polyurethane (PU), polybutylene terephthalate (PBT), and polyethylene terephthalate (PET).

5. The brush cleaning apparatus of claim 1, wherein the core material and the porous material are different materials.

6. The brush cleaning apparatus of claim 1, wherein the plurality of holes have an average hole size between 0.5 millimeters and 2 millimeters.

7. The brush cleaning apparatus of claim 1, wherein the planar cleaning brush is configured to laterally extend past the substrate along opposing directions.

8. A brush cleaning apparatus, comprising:
   a substrate support configured to support a substrate;
   a planar cleaning brush having opposite first and second sides;
   a first nozzle configured to spray a cleaning liquid directly onto a backside of the planar cleaning brush, wherein a bottom of the first nozzle is separated from a top of the backside of the planar cleaning brush by a non-zero distance spanning an open region over the backside of the planar cleaning brush:
   a second nozzle configured to apply the cleaning liquid directly onto the substrate;
   wherein the first side comprises a planar cleaning surface defined by a porous material and configured to come into contact with the substrate supported by the substrate support;
   wherein the second side is defined by a core material, and wherein the core material has a bottommost surface that faces the substrate and that physically contacts a topmost surface of the porous material;
   wherein interior vertical sidewalls of the core material extend from a topmost surface of the core material to the bottommost surface of the core material to define a plurality of holes respectively extending through the core material, wherein the plurality of holes are configured to transfer the cleaning liquid, which is dispensed directly onto the second side of the planar cleaning brush, from the second side of the planar cleaning brush to the porous materials;
   wherein additional interior vertical sidewalls of the porous material extend from the topmost surface of the porous material to a bottommost surface of the porous material to define a plurality of openings that are directly below the plurality of holes, the plurality of holes and the plurality of openings collectively forming a continuous and linear path between the topmost surface of the core material and the bottommost surface of the porous material, as viewed in a cross-sectional view;

wherein two of the interior vertical sidewalls within the core material and two of the additional interior vertical sidewalls of the porous material are separated by equal distances; and wherein the porous material comprises one of polyvinyl alcohol (PVA), polyamide (PA), polyurethane (PU), polybutylene terephthalate (PBT), and polyethylene terephthalate (PET).

9. The brush cleaning apparatus of claim 8, the continuous and linear path is perpendicular to the planar cleaning surface.

10. The brush cleaning apparatus of claim 8,
wherein the planar cleaning brush is disposed directly between the first nozzle and the substrate.

11. The brush cleaning apparatus of claim 8, wherein the core material includes at least one of polypropene (PP), polythene (PE), and polyvinyl chloride (PVC).

12. The brush cleaning apparatus of claim 8, wherein the cleaning liquid comprises water, $NH_4OH$ or HF.

13. The brush cleaning apparatus of claim 8, wherein the first nozzle is oriented at a different angle than the second nozzle.

14. The brush cleaning apparatus of claim 8, wherein the core material contacts the porous material between the plurality of holes.

15. A brush cleaning apparatus, comprising:
a substrate support configured to support a substrate;
a planar cleaning brush having opposite first and second sides;
a first nozzle configured to spray a cleaning liquid directly onto a backside of the planar cleaning brush, wherein a bottom of the first nozzle is separated from a top of the backside of the planar cleaning brush by a non-zero distance spanning an open region over the backside of the planar cleaning brush;
a second nozzle configured to apply the cleaning liquid directly onto the substrate;
wherein the first side comprises a planar cleaning surface defined by a porous material and configured to come into contact with the substrate supported by the substrate support;
wherein the second side is defined by a core material, the core material having a bottommost surface that faces the substrate and that physically contacts a topmost surface of the porous material;
wherein interior vertical sidewalls of the core material extend from a topmost surface of the core material to the bottommost surface of the core material to define a plurality of holes respectively extending through the core material, wherein the plurality of holes are configured to transfer the cleaning liquid, which is dispensed directly onto the second side of the planar cleaning brush, from the second side of the planar cleaning brush to the porous materials;
wherein additional interior vertical sidewalls of the porous material extend from the topmost surface of the porous material to a bottommost surface of the porous material to define a plurality of openings that are directly below the plurality of holes, the plurality of holes and the plurality of openings collectively forming a continuous and linear path between the topmost surface of the core material and the bottommost surface of the porous material, as viewed in a cross-sectional view;
wherein two of the interior vertical sidewalls within the core material and two of the additional interior vertical sidewalls of the porous material are separated by equal distances; and
the plurality of holes have an average hole size between 0.5 millimeters and 2 millimeters.

16. The brush cleaning apparatus of claim 15, wherein the planar cleaning surface is a circular surface as viewed from a top-view of the planar cleaning surface.

17. The brush cleaning apparatus of claim 15,
wherein the first nozzle is pointed at a different angle than the second nozzle.

18. The brush cleaning apparatus of claim 15, wherein an outermost sidewall of the porous material is directly below the bottommost surface of the core material.

19. The brush cleaning apparatus of claim 15,
wherein the second nozzle is arranged laterally outside of the planar cleaning brush.

20. The brush cleaning apparatus of claim 15, wherein the plurality of holes are arranged in concentric circles.

* * * * *